(12) United States Patent
Lee

(10) Patent No.: US 7,135,362 B2
(45) Date of Patent: Nov. 14, 2006

(54) ISOLATION LAYER FOR CMOS IMAGE SENSOR AND FABRICATION METHOD THEREOF

(75) Inventor: Kyung-Lak Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/882,485

(22) Filed: Jun. 30, 2004

(65) Prior Publication Data

US 2005/0093088 A1    May 5, 2005

(30) Foreign Application Priority Data

Oct. 29, 2003   (KR) .................... 10-2003-0075963

(51) Int. Cl.
| | |
|---|---|
| H01L 21/8238 | (2006.01) |
| H01L 21/00 | (2006.01) |
| H01L 21/336 | (2006.01) |
| H01L 31/00 | (2006.01) |
| H01L 31/113 | (2006.01) |

(52) U.S. Cl. .................. 438/199; 438/200; 438/60; 438/73; 438/75; 438/142; 438/192; 257/446; 257/291; 257/292; 257/293; 257/443

(58) Field of Classification Search ............. 438/60, 438/73, 75, 142, 197, 199, 200; 257/446, 257/291, 292, 293, 443

See application file for complete search history.

(56) References Cited

U.S. PATENT DOCUMENTS

| | | | | |
|---|---|---|---|---|
| 6,291,280 B1 * | 9/2001 | Rhodes | ...................... | 438/199 |
| 6,329,218 B1 * | 12/2001 | Pan | ............................ | 438/57 |
| 6,344,669 B1 * | 2/2002 | Pan | ............................ | 257/291 |
| 6,563,187 B1 * | 5/2003 | Park | ........................... | 257/446 |
| 6,583,484 B1 * | 6/2003 | Pan et al. | ................... | 257/461 |

FOREIGN PATENT DOCUMENTS

KR    2003-0058291    7/2003

OTHER PUBLICATIONS

Korean Notice of Preliminary Rejection dated Sep. 27, 2005 for KR 2003-0075963, filed Oct. 29, 2003.

* cited by examiner

Primary Examiner—Douglas W. Owens
Assistant Examiner—Samuel A. Gebremariam
(74) Attorney, Agent, or Firm—Blakely, Sokoloff Taylor & Zafman

(57) ABSTRACT

The present invention relates to an isolation layer for CMOS image sensor and a fabrication method thereof, which are capable of improving a low light level characteristic of the CMOS image sensor. The isolation layer includes: a field insulating layer formed on a predetermined portion of a substrate in the logic area to thereby define an active area and a field area; a field stop ion implantation area formed on a predetermined portion of the substrate in the pixel area, the field stop ion implantation area having a predetermined depth from a surface of the substrate to define an active area and a field area; and an oxide layer deposited on a substrate surface corresponding to the field stop ion implantation area.

10 Claims, 6 Drawing Sheets

_US 7,135,362 B2_

ISOLATION LAYER FOR CMOS IMAGE SENSOR AND FABRICATION METHOD THEREOF

FIELD OF THE INVENTION

The present invention relates to an image sensor; and, more particularly, to an isolation layer for a CMOS image sensor and a fabrication method thereof, which is capable of improving a low light level characteristic by adopting an isolation layer having no crystal defect in a pixel array area.

DESCRIPTION OF RELATED ART

Generally, an image sensor is an apparatus to convert an optical image into an electrical signal. Such an image sensor is largely classified into a CMOS image sensor and a charge coupled device.

In case of the charge coupled device (CCD), individual metal oxide silicon (MOS) capacitors are disposed very close to each other and charge carriers are stored in and transferred to the capacitors. Meanwhile, in case of the CMOS image sensor, MOS transistors and formed by CMOS technology that uses a control circuit and a signal processing circuit as a peripheral circuit. Herein, the number of the MOS transistors is directly proportional to the number of the pixels. Using the MOS transistors, output data are detected in sequence through a switching operation.

The CMOS image sensor is widely used in many devices, such as PC camera, digital still camera, digital camcorder, and the like. Due to a recent application to small-sized products such as cellular phone, products tend to have high resolution and small chip size.

As the CMOS image sensor becomes small-sized, a 0.35-micrometer technology is applied, instead of a technology having 0.5 micrometer to 0.8 micrometer line width. Due to it, several problems occur. Such problems will be described with reference to FIGS. 1A and 1B.

FIG. 1A is a circuit diagram of a conventional CMOS image sensor.

Referring to FIG. 1A, the CMOS image sensor includes a unit pixel consisting of one photodiode 100 and four transistors.

The photodiode 100 receives light to generate photoelectric charges. The four transistors in the unit pixel 100 include a transfer transistor 101, a reset transistor 103, a drive transistor 104, and a select transistor 105. The transfer transistor 101 transfers photoelectric charges generated in the photodiode 101 to a floating diffusion area 102. The reset transistor 103 sets an electric potential of the floating diffusion area to a desired level and resets the floating diffusion area 102 by discharging photoelectric charges. The drive transistor 104 receives a voltage level of the floating diffusion area 102 and acts as a source follower. The select transistor 105 outputs digital data to an output terminal in response to address signals. A load transistor is provided outside the unit pixel in order to allow an output signal to be read out.

The image sensor is provided with a pixel array area having tens to hundreds of thousands of unit pixels, a logic area for signal-processing an output of the pixel array area. In the isolation layer of the conventional CMOS image sensor, thermal oxide layers are used in both the pixel array area and the logic area. Therefore, a low light level characteristic of the CMOS image sensor is bad.

FIG. 1B is a cross-sectional view of the isolation layer, which is commonly applied in the pixel array area and the logic area of the conventional CMOS image sensor.

Referring to FIG. 1B, an isolation layer 11 is formed on a predetermined portion of a substrate 10 to define a plurality of active areas. Gate electrodes 12 of transistors are formed in the active area. Spacers 13 are formed on both sidewalls of the gate electrode 12. A source/drain region 14 is formed on one side of the gate electrode. Instead of the source/drain region, a photodiode may be formed in the pixel array area.

Since the conventional isolation layer is formed using a thermal oxidation, a low light level characteristic of the CMOS image sensor is bad. Its description will be made below.

The conventional isolation layer 11 is formed through a thermal oxidation at a temperature of 900° C. to 1100° C. for a long time. In this case, a lattice defect 15 in silicon often occurs at a boundary between the active area and the field area. Such a lattice defect 15 is also referred to as an oxidation induced stacking fault (OISF).

Since such a lattice defect 15 has a deep trap level, electrons are easily captured or discharged, such that unintended leakage current may be generated.

The CMOS image sensor receives incident light to generate photoelectric charges using the photodiode and reproduces an image through a signal processing. Therefore, the leakage current occurs as noise under a low light level environment.

Specifically, since the photodiode is formed adjacent to the isolation layer in the pixel array area, a serious degradation of picture quality is caused when such a leakage current flows into the photodiode.

In other words, in the low light level environment, a signal corresponding to a slight external light must be outputted from the photodiode. However, if the leakage current flows into the photodiode, a dark current phenomenon that a current is generated even in a lightless environment happens, such that the picture quality of the CMOS image sensor is seriously degraded.

Although many attempts to reduce the number of crystal defect causing a degradation of the low light level characteristic have been made, distinct solutions are not proposed till now.

SUMMARY OF THE INVENTION

It is, therefore, an object of the present invention to provide an isolation layer for CMOS image sensor and a fabrication method thereof, which are capable of improving a low light level characteristic by adopting an isolation layer having no crystal defect in pixel array area.

In an aspect of the present invention, there is provided an isolation layer for a CMOS image sensor including a pixel array and a logic area. The isolation layer includes: a field insulating layer formed on a predetermined portion of a substrate in the logic area to thereby define an active area and a field area; a field stop ion implantation area formed on a predetermined portion of the substrate in the pixel area, the field stop ion implantation area having a predetermined depth from a surface of the substrate to define an active area and a field area; and an oxide layer deposited on a substrate surface corresponding to the field stop ion implantation area.

In another aspect of the present invention, there is a method for fabricating an isolation layer of a CMOS image sensor including a pixel array area and a logic area. The method includes the steps of: forming a field oxide layer only in the logic area using a thermal oxidation; forming a field stop ion implantation area only in a region in which an isolation layer is to be formed in the pixel array area; depositing an oxide layer on the pixel array area and the logic area; depositing a photoresist on the oxide layer; leaving the photoresist only in an area corresponding to the field stop ion implantation area; flowing the left photoresist; and performing an etching process using the flowed photoresist as a mask to leave the oxide layer formed in an area corresponding to the field stop ion implantation area and to remove the oxide layer formed in the logic area.

BRIEF DESCRIPTION OF THE DRAWINGS

The above and other objects and features of the instant invention will become apparent from the following description of preferred embodiments taken in conjunction with the accompanying drawings, in which:

FIGS. 2A to 2I are cross-sectional views illustrating a fabrication method of a CMOS image sensor in accordance with an embodiment of the present invention.

DETAILED DESCRIPTION OF THE INVENTION

Figure 1A:
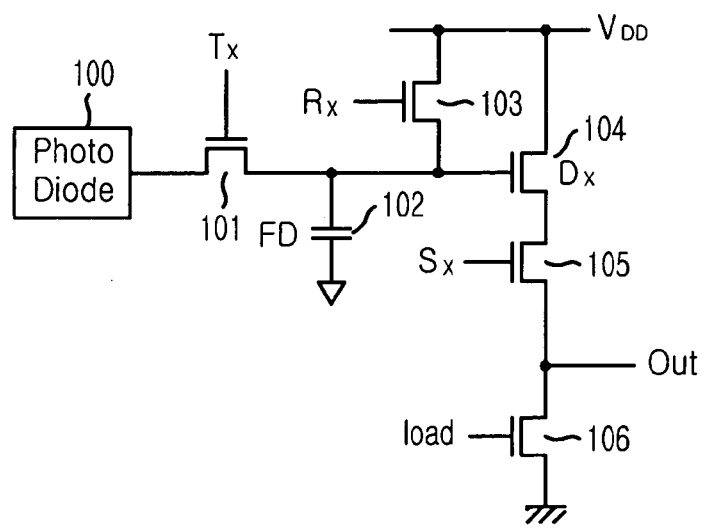
FIG. 1A is a circuit diagram showing a unit pixel of a conventional CMOS image sensor.
Figure 1B:
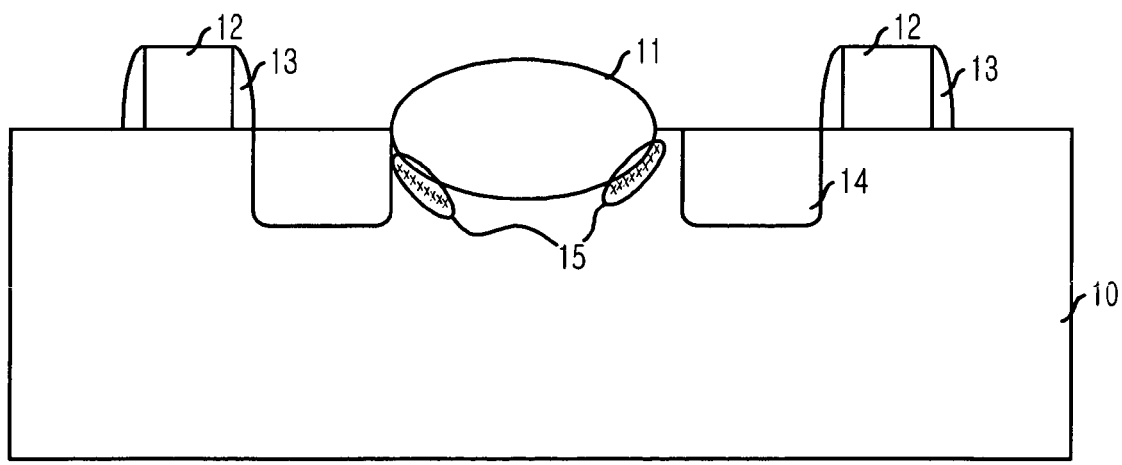
FIG. 1B is a cross-sectional view of a crystal defect, which is formed at edge portions of an isolation layer when the isolation layer is formed using a thermal oxide layer.

An isolation layer for a CMOS image sensor and fabrication method thereof in accordance with an embodiment of the present invention will be described in detail with reference to the accompanying drawings.

FIGS. 2A to 2I are cross-sectional views illustrating a fabrication method of a CMOS image sensor in accordance with an embodiment of the present invention. In the drawings, there is shown a process of forming an isolation layer in a state that the image sensor is divided into a pixel array area and a logic area. After forming the isolation layer as shown in FIGS. 2A to 2I, a fabricating process of a general CMOS image sensor is performed.

An embodiment of the present invention will be described with reference to FIGS. 2A to 2I.

First, an isolation layer in accordance with the present invention is applied to only the pixel array area, and a conventional isolation layer using a thermal oxidation is applied to the logic area. Accordingly, an existing transistor formed in the logic area is not affected.

Figure 2A:
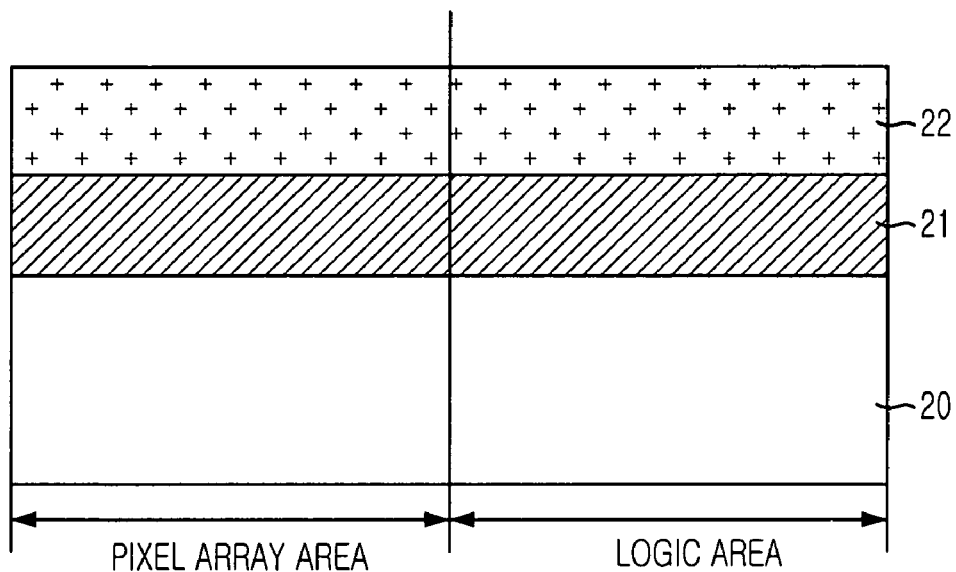

Referring to FIG. 2A, a pad oxide layer 21 and a pad nitride layer 22 are sequentially formed on a whole substrate 20 including both a pixel array area and a logic area.

The pad oxide layer 21 and the pad nitride layer 22 are used in a process of forming an isolation layer using a thermal oxidation. The pad oxide layer 21 is approximately 100 Å to approximately 150 Å thick and the pad nitride layer 22 is approximately 1000 Å to approximately 2000 Å thick.

Figure 2B:
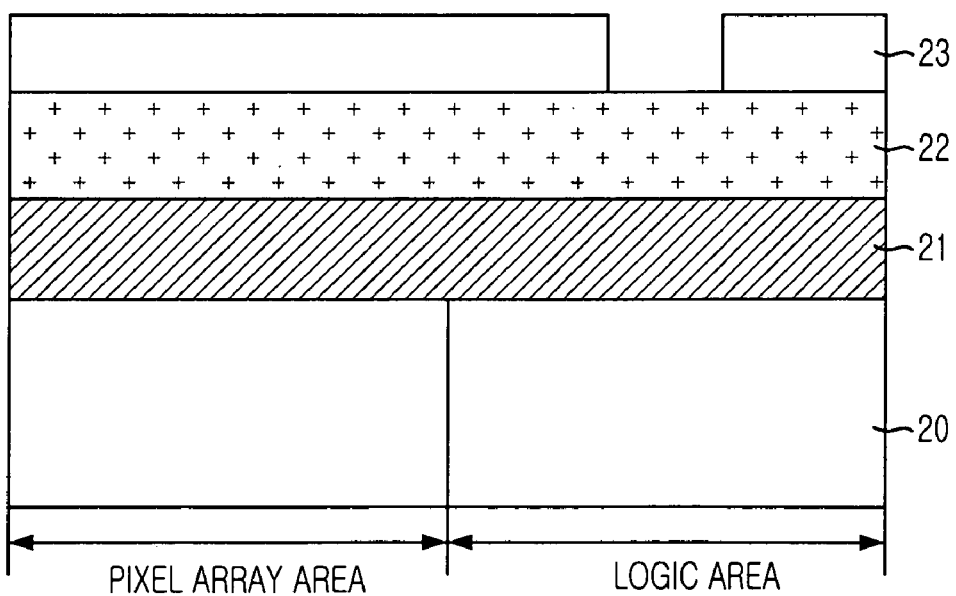

Referring to FIG. 2B, a first isolation (ISO) mask 23 is formed on the pad nitride layer 22 to expose a portion of the logic area. Here, the first ISO mask 23 is used to selectively remove the pad nitride layer 22 and the pad oxide layer 21 in the logic area.

Figure 2C:
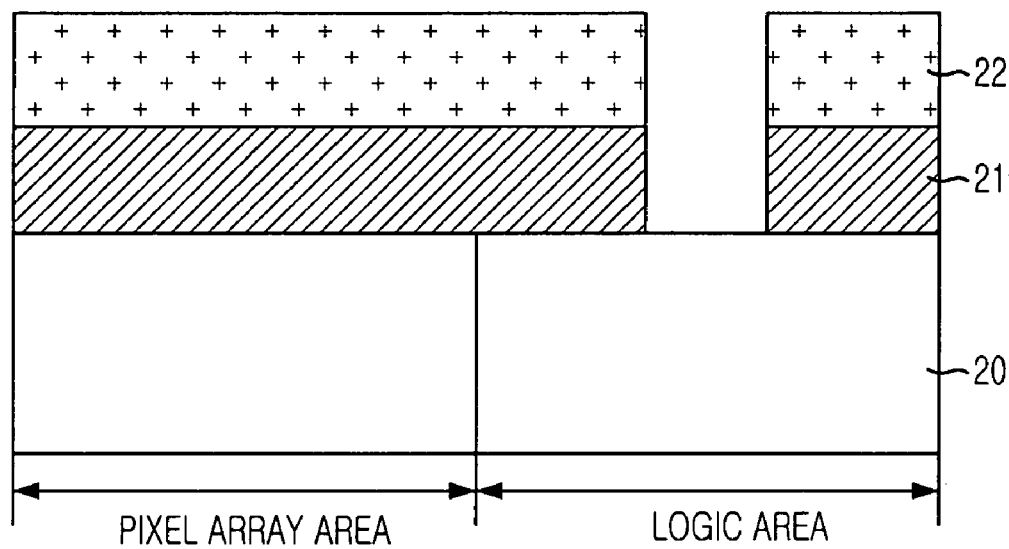

Referring to FIG. 2C, the pad nitride layer 22 and the pad oxide layer 21 formed in the logic area are selectively removed using the first ISO mask 23, thereby exposing a portion of the substrate in the logic area. At this time, a field oxide layer will be formed in the exposed substrate area.

Figure 2D:
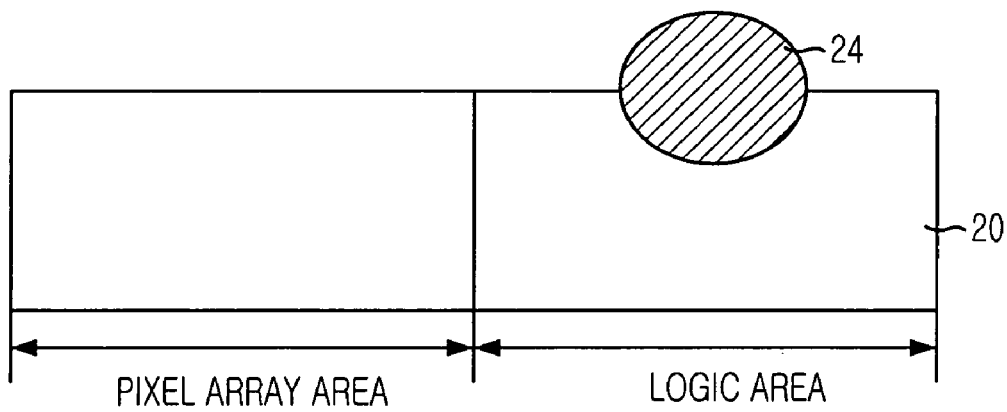

Referring to FIG. 2D, a field oxide layer 24 is formed only in the logic area through a thermal oxidation at a temperature of approximately 990° C. to approximately 1100° C. for a long time.

The process of forming the field oxide layer 24 is identical to the general thermal oxidation. The field oxide layer 24 is approximately 3000 Å to approximately 5000 Å thick.

Next, after the field oxide layer 24 is formed only in the logic area, the pad nitride layer 22 and the pad oxide layer 21 are removed.

Figure 2E:
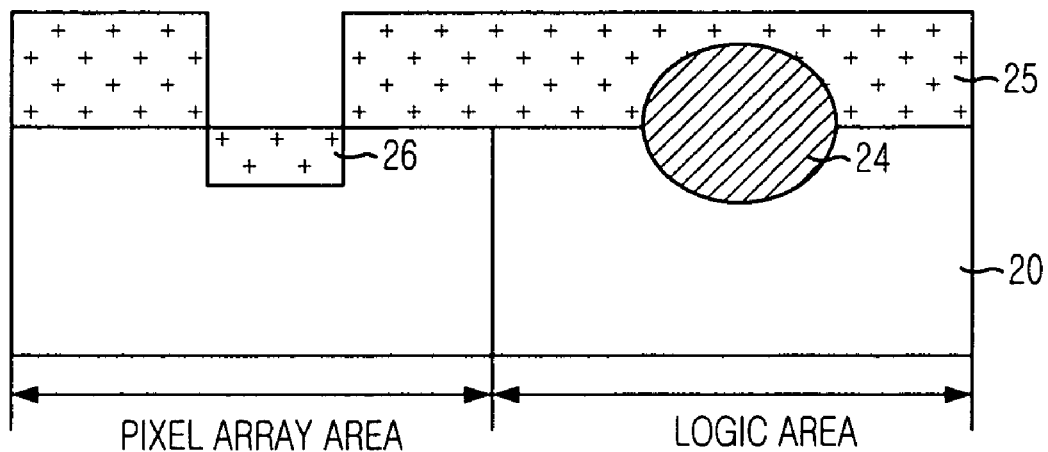

Referring to FIG. 2E, a field stop ion implantation mask 25 is formed on the substrate 20 in order to form a field stop ion implantation region 26 only at a portion of the pixel array area. In accordance with the embodiment of the present invention, the field stop ion implantation mask 25 exposes a predetermined portion of the pixel array area.

Subsequently, a field stop ion implantation process is performed using $B_{11}$. As ion implantation conditions, a proper energy and a proper dose are used so that an ion implantation depth (Rp) of approximately 0.3 m to approximately 0.5 m can be secured.

Then, the field stop ion implantation mask 25 is removed. Elements to be formed in the pixel array area are electrically separated through the field stop ion implantation process.

Figure 2F:
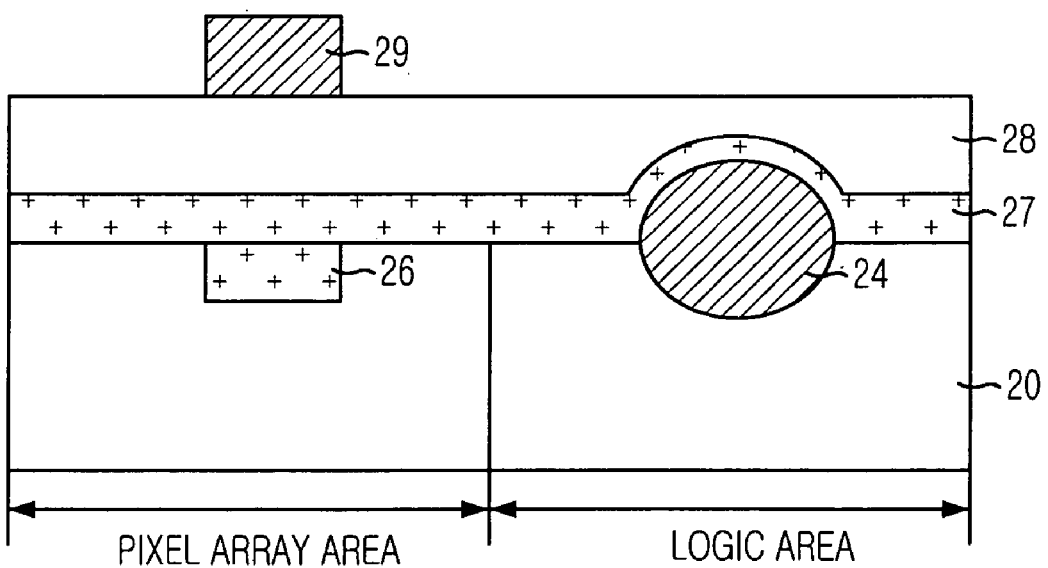

Referred to FIG. 2F, a CVD oxide layer 27 of approximately 1000 Å to approximately 2000 Å thick is formed on an entire substrate 20 including the pixel array area and the logic area through a chemical vapor deposition (CVD).

In FIG. 2F, the CVD oxide layer 27 is deposited on a flat substrate surface in the pixel array area. Meanwhile, the CVD oxide layer 27 is deposited along the shape of the field oxide layer 24 in the logic area.

In this manner, the CVD oxide layer 27 functions to isolate elements in the pixel array area together with the field stop ion implantation area 26 through a following process.

Then, a photoresist 28 is deposited on an entire CVD oxide layer 27. At this time, an etching selection ratio of the photoresist 28 to the CVD oxide layer 27 is approximately 1:1. The reason will be described later.

Next, a second ISO mask 29 is formed on the photoresist 28. The second ISO mask 29 covers only an area corresponding to the field stop ion implantation area 26, that is, an area in which the isolation layer is necessary in the pixel array area. The photoresist 28 formed in the area except for the field stop ion implantation area 26 is exposed.

Figure 2G:
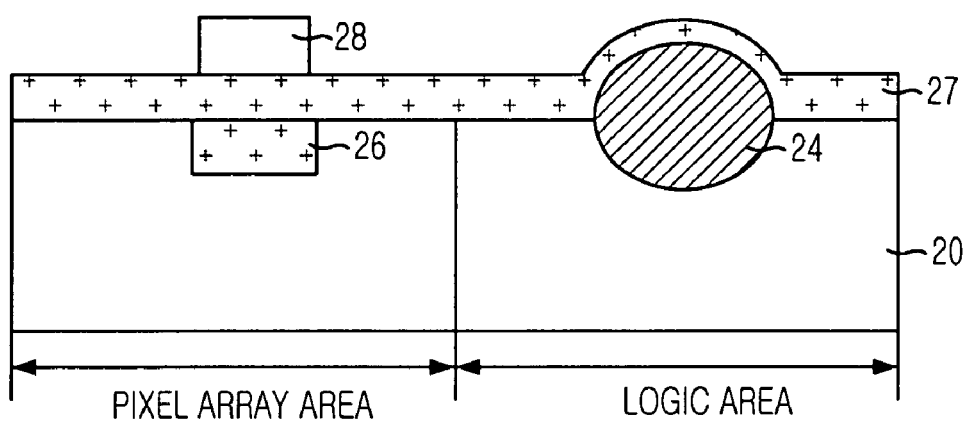

Referred to FIG. 2G, an exposure process is performed using the second ISO mask 29 to leave only an area corresponding to the field stop ion implantation area 26 and remove the photoresist 28 formed in the other area.

Figure 2H:
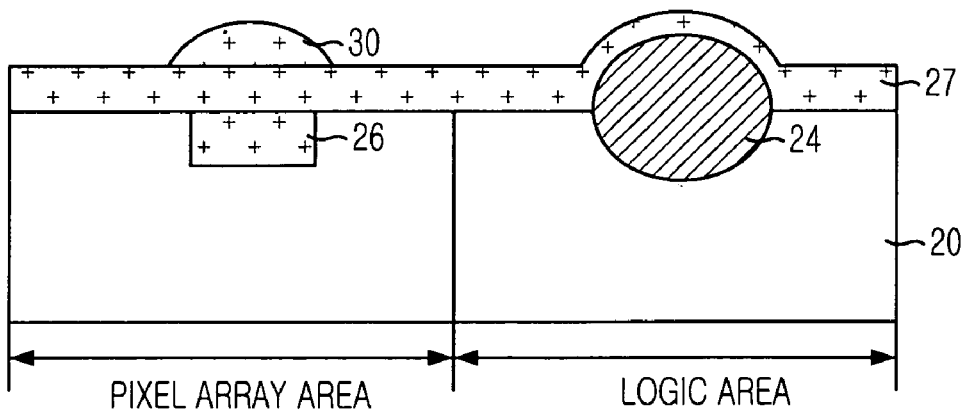
Figure 21:
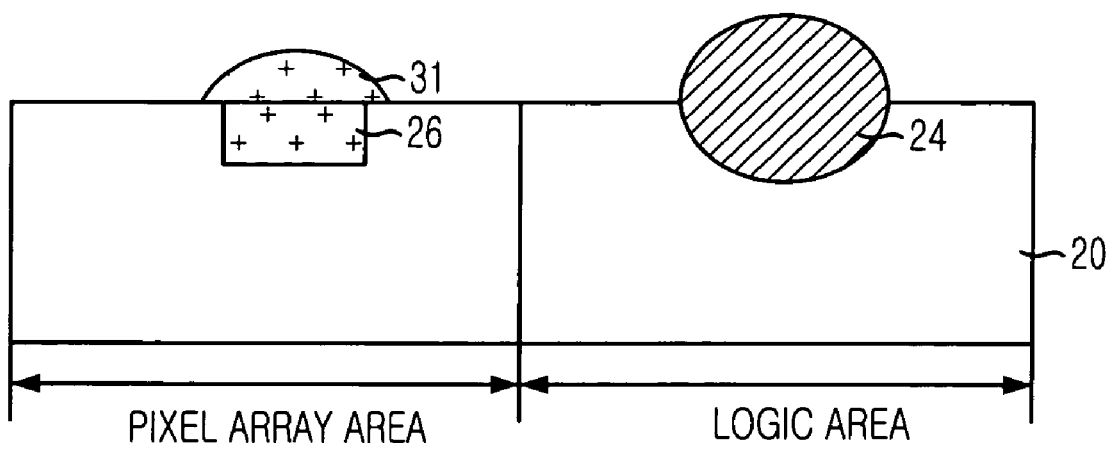

Referring to FIG. 2H, a thermal process is performed to flow a remaining portion of photoresist 29 shown in FIG. 2G so that the remaining portion of the photoresist 29 can have a proper shape and width. Herein, a reference numeral 30 denotes the flowed photoresist.

At this time, it is preferable to flow the flowed photoresist 30 so that the flowed photoresist 30 has the similar shape and width to the CVD oxide layer 27.

Then, a portion of the CVD oxide layer 27 formed in the pixel array area and the CVD oxide layer 27 formed in the logic area are removed by a dry etching process using the flowed photoresist 30 as a mask.

Since the flowed photoresist 30 has the etching selection ratio of approximately 1:1 with respect to the CVD oxide layer 27, the resulting structure after the dry etching process is formed as shown in FIG. 2I.

That is, in the pixel array area, the CVD oxide layer 31 remaining in the area corresponding to the field stop ion implantation area 26 has the substantially similar shape to the flowed photoresist 30. Therefore, the CVD oxide layer 27 formed in the logic area is all removed.

Referring to FIG. 2I, while the field oxide layer 24 formed using the conventional thermal oxidation is used as the isolation layer in the logic area, the field stop ion implantation area 26 and the CVD oxide layer acts as the isolation layer in the pixel array area.

Since the field oxide layer used as the isolation layer in the prior art is not used in the pixel array area, it is possible to prevent the crystal defect from occurring at the boundary between the field oxide layer and the active area. As a result, the present invention can remarkably improve the low light level characteristic of the CMOS image sensor.

The present application contains subject matter related to the Korean patent application No. KR 2003-0075963, filed in the Korean Patent Office on Oct. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A method for fabricating an isolation layer of a CMOS image sensor including a pixel array area and a logic area, the method comprising the steps of:
    forming a field oxide layer only in the logic area using a thermal oxidation;
    forming a field stop ion implantation area only in a region in which an isolation layer is to be formed in the pixel array area;
    depositing an oxide layer on the pixel array area and the logic area;
    depositing a photoresist on the oxide layer;
    leaving the photoresist only in an area corresponding to the field stop ion implantation area;
    flowing a remaining portion of the photoresist; and
    performing an etching process using the flowed photoresist as a mask to leave the oxide layer formed in an area corresponding to the field stop ion implantation area and to remove the oxide layer formed in the logic area.

2. The method as recited in claim 1, wherein an etching selection ratio of the photoresist to the oxide layer is approximately 1:1 in the step of depositing the photoresist on the oxide layer.

3. The method as recited in claim 2, wherein the flowed photoresist is flowed to have a shape substantially identical to the oxide layer formed on the field oxide layer.

4. The method as recited in claim 3, wherein the oxide layer left on the area corresponding to the field stop ion implantation area has a shape identical to the flowed photoresist in the etching process.

5. The method as recited in claim 1, wherein the step of depositing the oxide layer on the pixel array area and the logic area is performed using a chemical vapor deposition (CVD).

6. The method as recited in claim 5, wherein the oxide layer formed using the chemical vapor deposition is approximately 1000 Å to approximately 2000 Å thick.

7. The method as recited in claim 1, wherein the step of leaving the photoresist only in the area corresponding to the field stop ion implantation area further includes the steps of:
    forming a first mask for exposing only an area corresponding to the field stop ion implantation area on the photoresist; and
    performing a photo process using the first mask.

8. The method as recited in claim 1, wherein an ion of the field stop ion implantation area is $B_{11}$ and the field stop ion implantation area has an ion implantation depth of approximately 0.3 m to approximately 0.5 m.

9. The method as recited in claim 1, wherein the step of forming the field oxide layer includes the steps of:
    depositing a pad oxide layer and a pad nitride layer on the substrate of the pixel array area and the logic area;
    forming a second mask on the pad nitride layer, the second mask exposing only an area in which the field oxide layer is to be formed in the logic area;
    selectively removing the pad oxide layer and the pad nitride layer using the second mask, thereby exposing a predetermined portion of the substrate in the logic area;
    performing a thermal oxidation to form the field oxide layer on the exposed substrate of the logic area; and
    removing the pad oxide layer and the pad nitride layer.

10. The method as recited in claim 9, wherein the field oxide layer is approximately 3000 Å to approximately 5000 Å thick.

* * * * *